United States Patent
Hong

(10) Patent No.: US 8,664,052 B2
(45) Date of Patent: Mar. 4, 2014

(54) SEMICONDUCTOR DEVICE AND MANUFACTURING METHOD FOR THE SAME

(75) Inventor: Zhongshan Hong, Beijing (CN)

(73) Assignee: Semiconductor Manufacturing International (Beijing) Corporation (CN)

( * ) Notice: Subject to any disclaimer, the term of this patent is extended or adjusted under 35 U.S.C. 154(b) by 43 days.

(21) Appl. No.: 13/316,451

(22) Filed: Dec. 9, 2011

(65) Prior Publication Data

US 2013/0062695 A1    Mar. 14, 2013

(30) Foreign Application Priority Data

Sep. 9, 2011    (CN) .......................... 2011 1 0266369

(51) Int. Cl.
*H01L 21/00*    (2006.01)

(52) U.S. Cl.
USPC .................................. 438/164; 257/E21.629

(58) Field of Classification Search
USPC ......... 438/268, 156, 164, 173, 192, 206, 212; 257/E21.629, E21.643
See application file for complete search history.

(56) References Cited

U.S. PATENT DOCUMENTS

| 7,323,375 B2* | 1/2008 | Yoon et al. ..................... 438/164 |
| 2012/0306005 A1* | 12/2012 | Satoh et al. ................... 257/330 |

* cited by examiner

*Primary Examiner* — Quoc Hoang
(74) *Attorney, Agent, or Firm* — Innovation Counsel LLP

(57) ABSTRACT

A semiconductor device and manufacturing method for the same are disclosed. The method includes providing a substrate that has an insulator layer and a semiconductor layer overlying the insulator layer. The method further includes forming a hard mask layer pattern on the semiconductor layer and etching the semiconductor layer using the patterned hard mask layer to form portions having different thickness in the semiconductor layer. The method also includes performing an oxygen-based treatment on the semiconductor layer to form a supporting oxide layer. A portion of the semiconductor layer is buried in the supporting oxide layer.

19 Claims, 7 Drawing Sheets

SEMICONDUCTOR DEVICE AND MANUFACTURING METHOD FOR THE SAME

CROSS-REFERENCES TO RELATED APPLICATIONS

This application claims priority to Chinese Patent Application No. 201110266369.3, filed on Sep. 9, 2011 and entitled "Semiconductor Device and manufacturing method for the same", which is incorporated herein in its entirety by reference.

BACKGROUND OF THE INVENTION

1. Field of the Invention

This disclosure relates to semiconductor technology, and more particularly, to a semiconductor device and manufacturing method for the same.

2. Description of the Related Art

As semiconductor processing technology advances, the critical dimension (CD) of a semiconductor device continuously scales down. In such case, requirements for semiconductor manufacturing processes have become more stringent.

Taking a fin field effect transistor (FinFET) as an example, as the CD of the semiconductor device scales down, it is almost impossible to form a desired dimension of the fin, e.g., a width of the fin, by patterning with lithography. In such case, typically, a spacer image transfer (SIT) process is used to achieve a fin having such a small dimension.

In the SIT process, for example, first, spacers are formed adjacent to mandrels. After mandrels are removed, a semiconductor layer in a substrate such as a SOI substrate is etched using the spacers as a mask and then, fins are formed. In this process, the width of the spacer defines the width of the fin.

However, in the prior art, how to prevent fin collapse/undesired remove during manufacturing becomes an importance problem, when the CD of fin continuously scales down.

FIG. 1A illustrates a schematic configuration for a prior art FinFET. As an example, a pair of fins is shown. However, those skilled in the art may appreciate that one or more fins can be included in the FinFET. In this example, a semiconductor-on-insulator (SOI) substrate is taken as an example. As shown in FIG. 1A, the semiconductor device 10 comprises a base substrate 100, an insulator layer 102 disposed on the base substrate 100, a patterned semiconductor layer 104 formed on the insulator layer 102, and a patterned hard mask layer 106 formed on the patterned semiconductor layer 104. The semiconductor layer 104 and the hard mask layer 106 form a fin structure. As shown, in this example, the fin structure is disposed on the insulator layer of the SOI substrate. As the thickness of the fin structure continuously decreases, the fin structure tends to collapse and/or be undesirably removed during subsequent manufacturing processes. As a result, the yield of the semiconductor device may be adversely affected.

FIG. 1B illustrates a schematic configuration for another prior art FinFET. The shown semiconductor device 10' differs from the semiconductor device 10 shown in FIG. 1A in that the hard mask layer 106 is removed. In such case, the semiconductor layer 104 forms the fin structure. Likewise, as the thickness of the fin structure continuously decreases, the fin structure tends to collapse and/or be undesirably removed during subsequent manufacturing processes. As a result, the yield of the semiconductor device may be adversely affected.

Therefore, there is a continuous demand in the art for an improved semiconductor device and a manufacturing method therefor.

BRIEF SUMMARY OF THE INVENTION

An object of this disclosure is to provide an improved method of manufacturing a semiconductor device, which can satisfy requirements for continuously decreased CD of the semiconductor device. Further, the method can provide a yield improvement.

Another object of this disclosure is to provide a semiconductor device, which can have decreased CD.

According to a first aspect of this disclosure, there is provided a method of manufacturing a semiconductor device. The method comprises providing a substrate that has an insulator layer and a semiconductor layer disposed thereon, the semiconductor layer has a first thickness; forming a hard mask layer on the semiconductor layer; and patterning the hard mask layer to partially expose a surface of the semiconductor layer. The method further includes etching the semiconductor layer using the patterned hard mask layer as a mask to form a first portion having the first thickness and a second portion having a second thickness that is smaller than the first thickness, wherein the first portion is adjacent to the second portion; and performing an oxygen-based treatment on the semiconductor layer to oxidize the second portion of the semiconductor layer to form a supporting oxide layer.

Optionally, the method can further comprise removing the patterned hard mask layer.

Preferably, the semiconductor layer can be a silicon layer.

Preferably, the hard mask layer can be selected from the group consisting of silicon nitride (SiN), silicon oxide ($SiO_2$), and silicon oxide nitride ($SiO_xN_y$).

Preferably, patterning the hard mask layer can be performed by a double patterning process.

Preferably, patterning the hard mask layer can be performed by a process with EUV, e-beam, or nanoimprint.

Preferably, in the method, the oxygen-based treatment can be an anisotropic oxygen plasma treatment using at least one of $O_2$, $O_3$, NO, and $NO_2$.

Preferably, in the method, the oxygen-based treatment can be an anisotropic oxygen plasma treatment performed in the atmosphere of oxygen and argon, under the pressure of 10-300 mTorr, at the bias of 200-500 V, wherein the flow rate of the oxygen is 20-200 sccm, the flow rate of the argon is 50-200 sccm.

Preferably, in the method, the oxygen-based treatment can comprise oxygen ions implantation.

Preferably, in the method, the oxygen ions implantation can be performed at implantation energy of 2-15 kev and at a dose of $10^{14}$ ions/cm$^2$ through $10^{16}$ ions/cm$^2$.

Optionally, in the method, the oxygen-based treatment can further form a sidewall oxide on a sidewall exposed from the first portion of the semiconductor layer.

Preferably, in the method, the thickness of the sidewall oxide can be not greater than ¼ of that of the supporting oxide layer.

Preferably, the method can further comprise removing the sidewall oxide.

Preferably, in the method, removing the sidewall oxide can be performed by a wet etching process.

Preferably, in the method, a portion of the semiconductor layer buried into the supporting oxide layer can comprise a thickness in the range from 1/10 to ⅓ of the first thickness of the semiconductor layer.

Preferably, in the method, the semiconductor device can be a FinFET, and the first portion of the semiconductor layer and the patterned hard mask layer can form a fin for the FinFET.

Preferably, in the method, the semiconductor device can be a FinFET, and the first portion of the semiconductor layer can form a fin for the FinFET.

Preferably, the method can further comprise forming a gate, source/drain regions of the FinFET.

Preferably, in the method, the semiconductor layer can comprise a plurality of the first portions and a plurality of the second portions.

According to another aspect of this invention, there is provided a semiconductor device. The semiconductor device can comprise a supporting oxide layer; and a semiconductor fin partially buried into the supporting oxide layer.

Optionally, the semiconductor device can further comprise a hard mask layer disposed on the semiconductor fin.

Preferably, the hard mask layer in the semiconductor device can be selected from the group consisting of silicon nitride (SiN), silicon oxide ($SiO_2$), and silicon oxide nitride ($SiO_xN_y$).

Preferably, the semiconductor fin can be a silicon layer.

Preferably, in the semiconductor device, a portion of the semiconductor fin buried into the supporting oxide layer can comprise a thickness in the range from 1/10 to 1/3 of a thickness of the semiconductor fin.

Preferably, the semiconductor device can be a FinFET.

Preferably, the semiconductor device can further comprise a gate in electrical contact with the semiconductor fin and source/drain regions formed on opposite sides of the gate.

Many benefits can be achieved by way of the present invention over conventional techniques. For example, the present invention can prevent or at least reduce collapsing of the fin structure or the unintentional removal of the fin structure, and thus, improve the yield of the semiconductor device.

BRIEF DESCRIPTION OF THE DRAWINGS

The following detailed description of some example embodiments will be better understood when read in conjunction with the accompanying drawings. It should be understood, however, that example embodiments are not limited to the precise arrangements and instrumentalities shown. In the drawings, like numerals are used to indicate like elements throughout. Furthermore, other desirable features and characteristics will become apparent from the subsequent detailed description and the appended claims, taken in conjunction with the accompanying drawings and the foregoing technical field and background.

For simplicity and clarity of illustration, the drawing figures illustrate the general manner of construction, and descriptions and details of well-known features and techniques may be omitted to avoid unnecessarily obscuring aspects of the illustrated embodiments. Additionally, elements in the drawings figures are not necessarily drawn to scale. For example, the dimensions of some of the elements or regions in some of the figures may be exaggerated relative to other elements or regions of the same or other figures to help improve the understanding of the example embodiments. In the drawings.

DETAILED DESCRIPTION OF THE INVENTION

The detailed description set forth below in connection with the appended drawings is intended as a description of some of the example embodiments, and is not intended to completely describe all possible embodiments. That is, there is no intention to be bound by any expressed or implied theory presented in the preceding technical field, background, or the following detailed description of example embodiments. It is to be understood that the same or equivalent functions may be accomplished by different embodiments.

The terms "first", "second", and the like in the description and the claims, if any, may be used for distinguishing between similar elements and not necessarily for describing a particular sequential or chronological order. It is to be understood that the terms so used are interchangeable under appropriate circumstances such that the embodiments described herein are, for example, capable of use in sequences other than those illustrated or otherwise described herein. Furthermore, the terms "comprise," "include," "have" and any variations thereof, are intended to cover non-exclusive inclusions, such that a process, method, article, or apparatus that comprises, includes, or has a list of elements is not necessarily limited to those elements, but may include other elements not expressly listed or inherent to such process, method, article, or apparatus.

A semiconductor device of this disclosure is described by reference to the drawings hereafter.

Figure 1A:
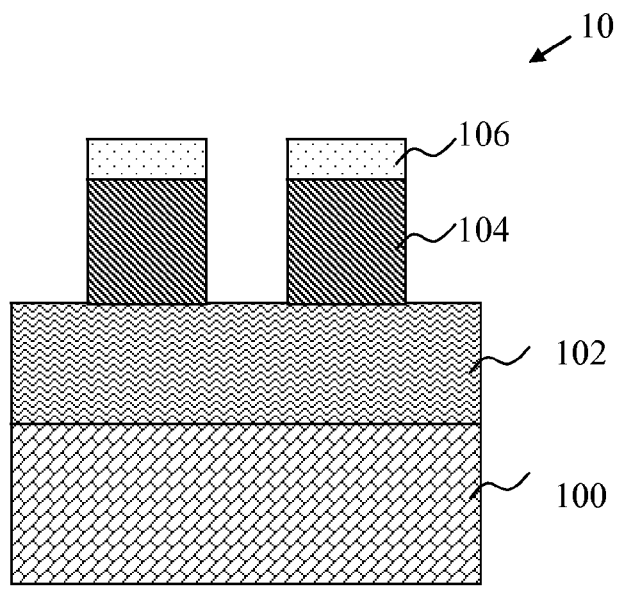
FIG. 1A illustrates a schematic cross-sectional view for a prior art Fin structure.
Figure 1B:
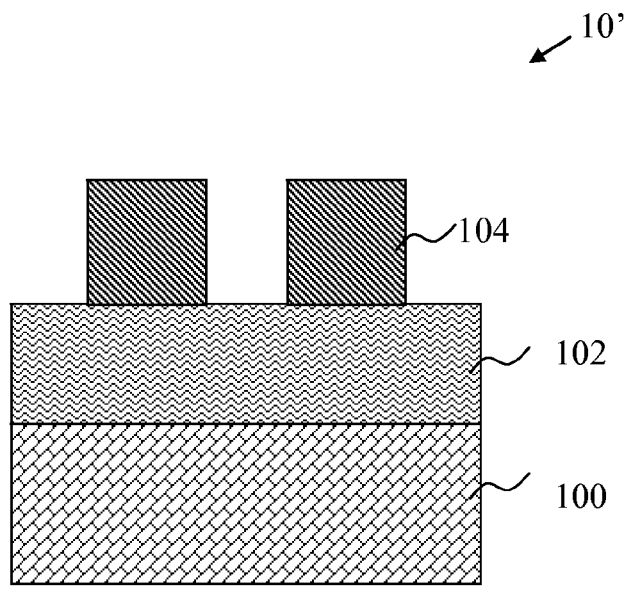
FIG. 1B illustrates a schematic cross-sectional view for another prior art Fin structure.
Figure 2A:
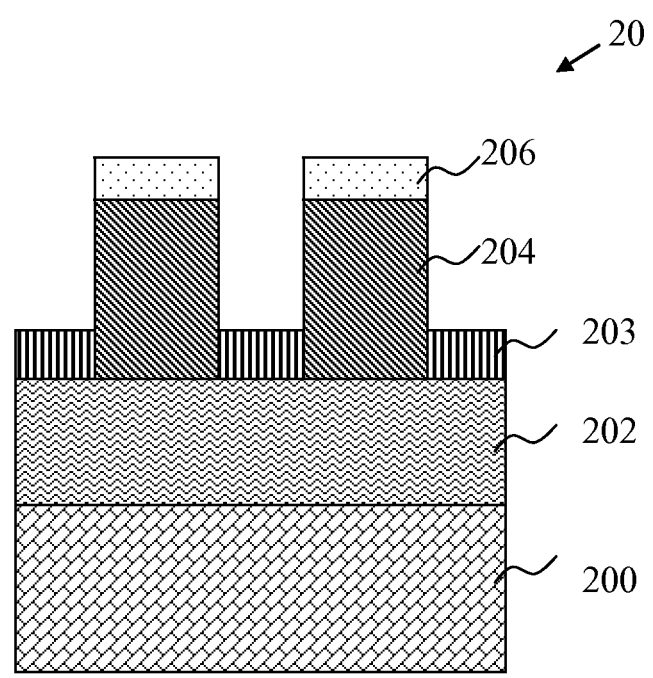
FIG. 2A illustrates a schematic cross-sectional view for a semiconductor device according to an embodiment of this disclosure.

FIG. 2A illustrates a schematic cross-sectional view of a semiconductor device 20 according to an embodiment of this disclosure. The description is made by taking a FinFET as an example herein.

FIG. 2A illustrates a schematic configuration for the FinFET according to this disclosure. As the example, a pair of fins is shown. However, those skilled in the art may appreciate that one or more fins can be included in the FinFET.

In an embodiment, the substrate is a semiconductor-on-insulator (SOI) substrate. As shown in FIG. 2A, the semiconductor device 20 comprises a base substrate 200, an insulator layer 202 disposed on the base substrate 200, a supporting oxide layer 203 disposed on the insulator layer 202, a semiconductor layer structure 204 disposed on the insulator layer 202, and a patterned hard mask layer 206 formed on the semiconductor layer structure 204. The semiconductor layer structure 204 and the hard mask layer 206 form a fin structure.

The patterned hard mask layer 206 can comprise, in an embodiment, at least one selected from the group consisting of silicon nitride (SiN), silicon oxide ($SiO_2$), and silicon oxide nitride ($SiO_xN_y$). The semiconductor layer structure 204 may include silicon.

As shown, the semiconductor layer structure 204 is partially buried in the supporting oxide layer 203. In an example embodiment, a portion of the semiconductor layer 204 buried in the supporting oxide layer 203 can have a thickness in the range from 1/10 to 1/3 of a first thickness of the semiconductor layer structure 204.

Figure 2B:
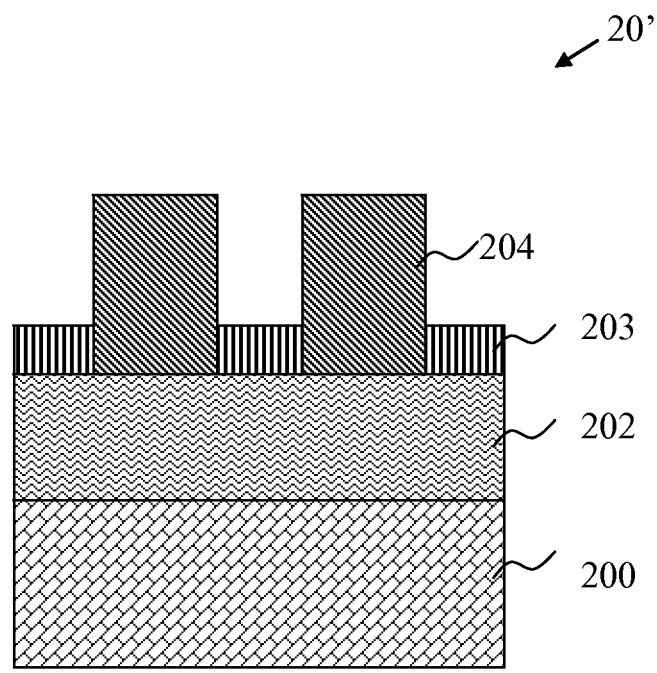
FIG. 2B illustrates a schematic cross-sectional view for a semiconductor device according to another embodiment of this disclosure.

FIG. 2B illustrates a schematic cross-sectional view for a semiconductor device 20' according to another embodiment of this disclosure. The shown semiconductor device 20' differs from the semiconductor device 20 shown in FIG. 2A in that the hard mask layer 206 is removed. In such case, the semiconductor layer 204 forms the fin structure. The other elements of the semiconductor 20' are similar to those of the semiconductor 20, and thus the detailed description thereof is omitted herein for the sake of brevity.

It is apparent to those skilled in the art that the semiconductor shown in FIGS. 2A and 2B can further comprise source/drain regions formed in the fin structure and a gate in electrical contact with the fin structure (not shown).

A method of manufacturing the semiconductor device according to the embodiment of this disclosure is described by reference to FIGS. 3-9 hereafter. The description is made by taking a method of manufacturing the FinFET as an example herein.

Figure 3:
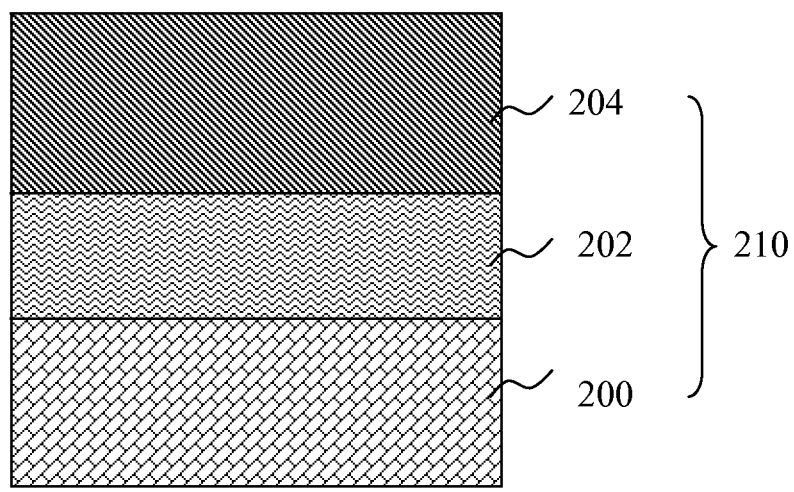
FIG. 3 illustrates a schematic cross-sectional view for a process in a method of manufacturing a semiconductor device according to an embodiment of this disclosure.

First, by reference to FIG. 3, a substrate 210 is provided. The substrate 210 comprises an insulator layer 202 and a semiconductor layer 204 having a first thickness disposed thereon. For example, the substrate 210 can be a SOI substrate having a base substrate 200.

The semiconductor layer 204 can be a silicon layer, in an example embodiment.

Figure 4:
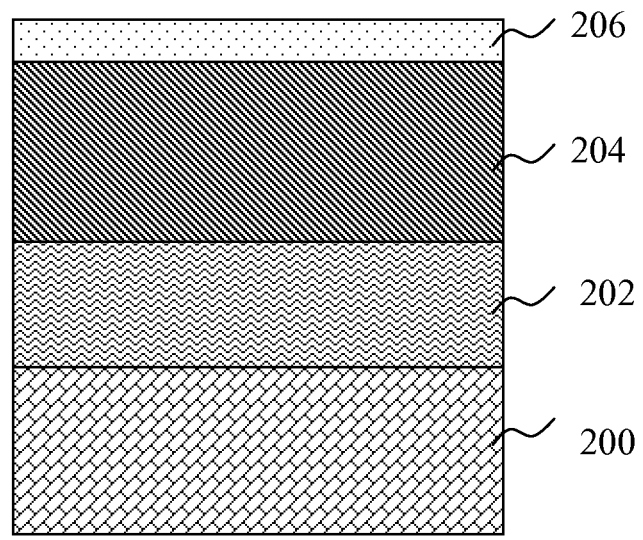
FIG. 4 illustrates a schematic cross-sectional view for a process, subsequent to that of FIG. 3, in the method of manufacturing the semiconductor device according to the embodiment of this disclosure.

Next, as shown in FIG. 4, a hard mask layer 206 is formed on the semiconductor layer 204. The hard mask layer 206 can comprise, in an example embodiment, at least one selected from the group consisting of silicon nitride (SiN), silicon oxide ($SiO_2$), and silicon oxide nitride ($SiO_xN_y$).

Figure 5:
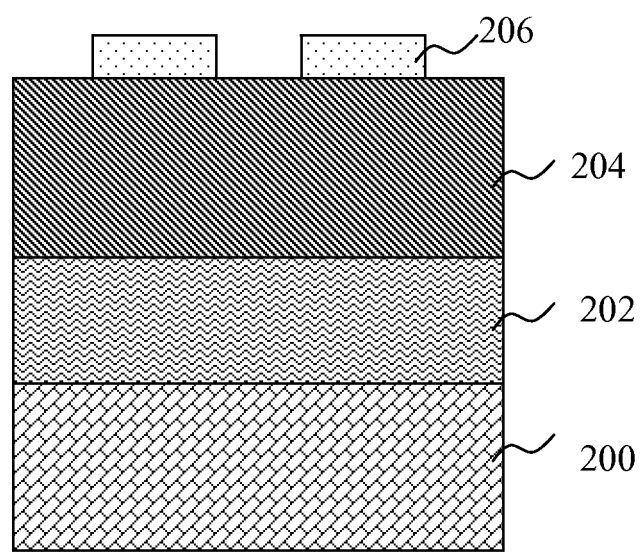
FIG. 5 illustrates a schematic cross-sectional view for a process, subsequent to that of FIG. 4, in the method of manufacturing the semiconductor device according to the embodiment of this disclosure.

Next, as shown in FIG. 5, the hard mask layer 206 is patterned to expose a portion of a surface of the semiconductor layer 204.

In this embodiment, the step of patterning the hard mask layer 206 can be performed by a conventional process. For example, a double pattering process such as a double lithography process can be used.

Alternatively, the step of patterning the hard mask layer 206 can be performed by a process with Extra-Ultra-Violet (EUV), e-beam, or nanoimprint.

Figure 6:
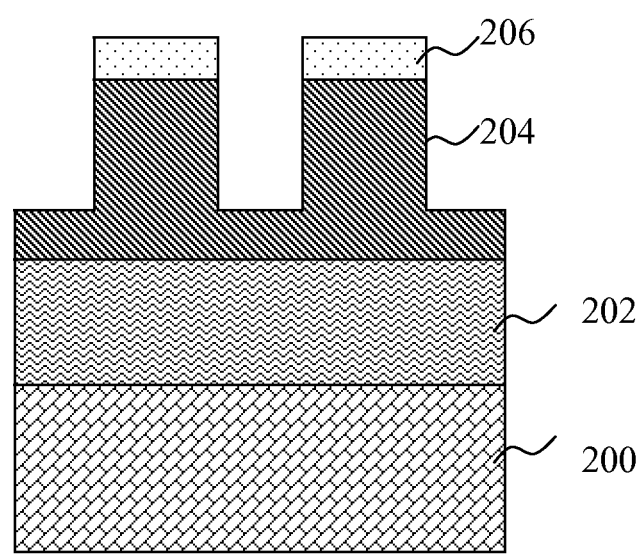
FIG. 6 illustrates a schematic cross-sectional view for a process, subsequent to that of FIG. 5, in the method of manufacturing the semiconductor device according to the embodiment of this disclosure.

Next, as shown in FIG. 6, portions of the thickness of the semiconductor layer 204 are etched using the patterned hard mask layer 206 as a mask. As a result, a first portion having the first thickness and a second portion having a second thickness are formed in the semiconductor layer 204. The first portion is adjacent to the second portion, and the second thickness is less than the first thickness. The first portion can correspond to the portion of the semiconductor layer 204 covered by the patterned hard mask layer 206 (which can also be referred as a thicker portion of the semiconductor layer), and the second portion can correspond to the other portion of the semiconductor layer 204 (which can also be referred as a thinner portion of the semiconductor layer). Although two first portions and three second portions are shown, those skilled in the art may appreciate that the number of the first portions and/or second portions can be any value according to required applications.

Figure 7:
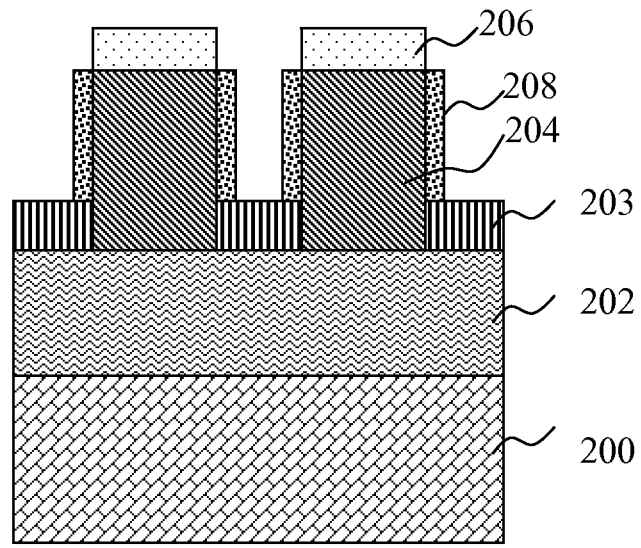
FIG. 7 illustrates a schematic cross-sectional view for a process, subsequent to that of FIG. 6, in the method of manufacturing the semiconductor device according to the embodiment of this disclosure.

Next, as shown in FIG. 7, an oxygen-based treatment is performed on the remained semiconductor layer 204 to oxidize the second portion of the semiconductor layer 204, so as to form a supporting oxide layer 203. The supporting oxide layer 203 can be $SiO_2$, for example.

Note that, although FIG. 7 shows that a sidewall oxide 208 is formed on the sidewall exposed from the first portion of the semiconductor layer 204, the sidewall oxide 208 is optional. Those skilled in the art may appreciate that, in a specific embodiment, using an anisotropic oxidization treatment, only the second portion of the semiconductor layer 204 can be oxidized to form the supporting oxide layer 203, but the sidewall oxide is not or substantially not formed on the sidewall exposed from the first portion of the semiconductor layer 204. In such case, as a result of the above oxygen-based treatment, the structure shown in FIG. 8 is generated.

Figure 8:
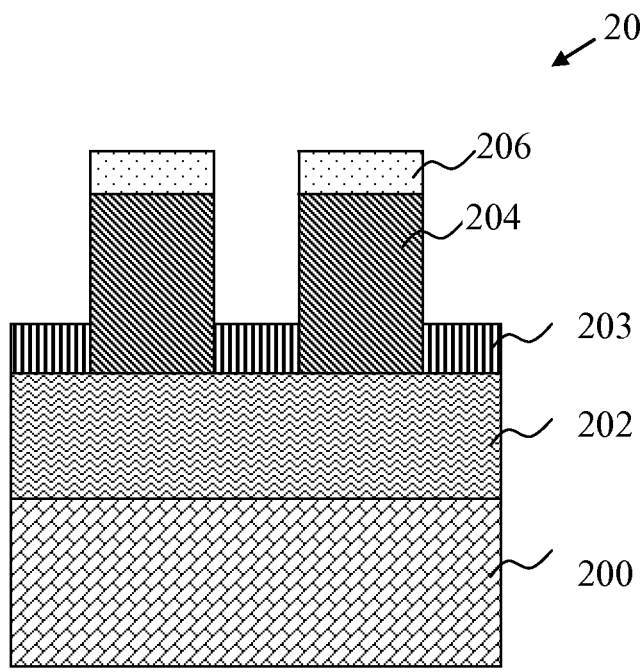
FIG. 8 illustrates a schematic cross-sectional view for a process, subsequent to that of FIG. 7, in the method of manufacturing the semiconductor device according to the embodiment of this disclosure.

As shown in FIG. 8, a part of the first portion of the semiconductor layer 204 is buried in the supporting oxide layer 203. According to a specific embodiment of the present invention, a portion of the first portion buried in the supporting oxide layer 203 has a thickness in the range from 1/10 to 1/3 of the first thickness of the semiconductor layer 204.

According to an embodiment of this invention, the above oxygen-based treatment can be an anisotropic oxygen plasma treatment using at least one of $O_2$, $O_3$, NO, and $NO_2$. For example, the oxygen-based treatment can be an anisotropic oxygen plasma treatment performed in the atmosphere of oxygen and argon, under the pressure of 10-300 mTorr, at the bias of 200-500 V, wherein the flow rate of the oxygen is 20-200 sccm, the flow rate of the argon is 50-200 sccm.

In an alternative embodiment of this invention, the oxygen-based treatment can be oxygen ions implantation. The oxygen ions implantation can be performed with an implantation energy of 2-15 kev and at a dose of $10^{14}$ ions/cm$^2$ through $10^{16}$ ions/cm$^2$.

As described above, optionally, the sidewall oxide 208 can further be formed on the sidewall exposed from the first portion of the semiconductor layer 204 by the above oxygen-based treatment. In such case, preferably, the formed sidewall oxide 208 is thin. For example, the thickness of the sidewall oxide 208 is not greater than 1/4 of the thickness of the supporting oxide layer 203. This can be implemented by the anisotropy of the oxygen-based treatment.

Next, the sidewall oxide 208 is removed to form the structure shown in FIG. 8. For example, the step of removing the sidewall oxide 208 can be performed by a wet etching process.

As shown in FIG. 8, when the semiconductor device 20 is a FinFET, the first portion of the semiconductor later 204 and patterned hard mask layer 206 form the fin for the FinFET device.

Figure 9:
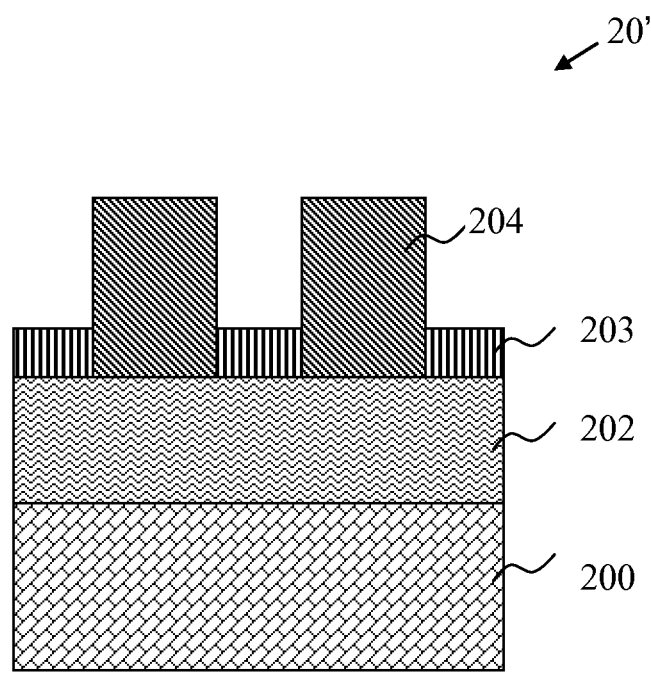
FIG. 9 illustrates a schematic cross-sectional view for a process, subsequent to that of FIG. 8, in the method of manufacturing the semiconductor device according to the embodiment of this disclosure.

According to another embodiment, as shown in FIG. 9, the method of manufacturing the semiconductor device can further comprise a step of removing the patterned hard mask layer 206. The removal of the patterned hard mask can be implemented by any appropriate method known in the field of semiconductor. For example, the patterned hard mask can be removed using grinding, chemical mechanical polishing (CMP), etching, and the like and the combination thereof.

As shown in FIG. 9, when the semiconductor device 20' is the FinFET device, the first portion of the semiconductor layer 204 can form the fin of the FinFET.

As appreciated by those skilled in the art, the method of manufacturing the semiconductor device according to the embodiment of this invention can further comprise forming a gate, source/drain regions of the FinFET, so as to complete the FinFET.

Up to now, the method of manufacturing the semiconductor device according to this invention and the formed semiconductor device have been described in details. The description for some details well known in the art may be omitted to avoid obscuring the concept of this invention. Those skilled in the art may completely know how to implement the technical solution disclosed herein from the above description.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

What is claimed is:

1. A method of manufacturing a semiconductor device, comprising:
   providing a substrate, the substrate including an insulator layer and a semiconductor layer disposed thereon;
   forming a hard mask layer on the semiconductor layer;
   patterning the hard mask layer to partially expose a surface of the semiconductor layer;
   etching the semiconductor layer using the patterned hard mask layer as a mask to form a first portion having a first thickness and a second portion having a second thickness smaller than the first thickness, wherein the first portion is adjacent to the second portion; and
   performing an oxygen-based treatment on the semiconductor layer to oxidize the second portion of the semiconductor layer to form a supporting oxide layer, the oxidized part of the second portion having a thickness that is from $1/10$ to $1/3$ of the first thickness.

2. The method of claim 1, further comprising:
   removing the patterned hard mask layer.

3. The method of claim 1, wherein the semiconductor layer is a silicon layer.

4. The method of claim 1, wherein the hard mask layer is selected from the group consisting of silicon nitride (SiN), silicon oxide ($SiO_2$), and silicon oxide nitride ($SiO_xN_y$).

5. The method of claim 1, wherein patterning the hard mask layer is performed by a double patterning process.

6. The method of claim 5, wherein the semiconductor device is a FinFET, and the first portion of the semiconductor layer forms a fin for the FinFET.

7. The method of claim 1, wherein patterning the hard mask layer is performed by a process with EUV, e-beam, or nanoimprint.

8. The method of claim 1, wherein the oxygen-based treatment is an anisotropic oxygen plasma treatment using at least one of $O_2$, $O_3$, NO, and $NO_2$.

9. The method of claim 1, wherein the oxygen-based treatment is an anisotropic oxygen plasma treatment performed in the atmosphere of oxygen and argon, under the pressure of 10-300 mTorr, at the bias of 200-500 V, wherein the flow rate of the oxygen is 20-200 sccm, the flow rate of the argon is 50-200 sccm.

10. The method of claim 1, wherein the oxygen-based treatment comprises oxygen ions implantation.

11. The method of claim 10, wherein the oxygen ions implantation is performed at an implantation energy of 2~15 key and at a dose of $10^{14}$ ions/cm$^2$ through $10^{16}$ ions/cm$^2$.

12. The method of claim 1, the oxygen-based treatment further forms a sidewall oxide on a sidewall exposed from the first portion of the semiconductor layer.

13. The method of claim 12, wherein the thickness of the sidewall oxide is not greater than $1/4$ of that of the supporting oxide layer.

14. The method of claim 12, further comprising removing the sidewall oxide.

15. The method of claim 14, wherein removing the sidewall oxide is performed by a wet etching process.

16. The method of claim 1, wherein a portion of the semiconductor layer buried into the supporting oxide layer comprises a thickness in the range from $1/10$ to $1/3$ of the first thickness of the semiconductor layer.

17. The method of claim 1, wherein the semiconductor device is a FinFET, and the first portion of the semiconductor layer and the patterned hard mask layer form a fin for the FinFET.

18. The method of claim 17, further comprising:
   forming a gate, source/drain regions of the FinFET.

19. The method of claim 1, wherein the semiconductor layer comprises a plurality of the first portions and a plurality of the second portions.

* * * * *